(12) United States Patent
Willett

(10) Patent No.: US 7,781,801 B2
(45) Date of Patent: Aug. 24, 2010

(54) FIELD-EFFECT TRANSISTORS WHOSE GATE ELECTRODES ARE OVER SEMICONDUCTOR HETEROSTRUCTURES AND PARTS OF SOURCE AND DRAIN ELECTRODES

(75) Inventor: Robert L Willett, Warren, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 83 days.

(21) Appl. No.: 11/526,968

(22) Filed: Sep. 25, 2006

(65) Prior Publication Data

US 2008/0073668 A1 Mar. 27, 2008

(51) Int. Cl.
*H01L 29/00* (2006.01)

(52) U.S. Cl. .............. 257/192; 257/183; 257/183.1; 257/190; 257/196; 257/E29.001

(58) Field of Classification Search ............. 257/192, 257/200, 260, 262, 194, 196, 183.1, 183, 257/190, 201, 288, 215, 216, 224, 243, 289, 257/E29.001

See application file for complete search history.

(56) References Cited

U.S. PATENT DOCUMENTS

| | | | | |
|---|---|---|---|---|
| 4,734,750 A * | 3/1988 | Okamura et al. | ............ | 257/187 |
| 5,219,772 A | 6/1993 | Baldwin et al. | ............... | 437/41 |
| 5,895,941 A | 4/1999 | Kitano | ....................... | 257/194 |
| 6,121,153 A | 9/2000 | Kikkawa | .................... | 438/706 |
| 6,344,662 B1 * | 2/2002 | Dimitrakopoulos et al. | ... | 257/40 |
| 6,495,409 B1 | 12/2002 | Manfra et al. | ............... | 438/216 |
| 7,242,041 B2 * | 7/2007 | Bucher et al. | ............... | 257/289 |
| 2003/0183844 A1 | 10/2003 | Yokoyama et al. | .......... | 257/192 |
| 2004/0238897 A1 | 12/2004 | Oishi | ......................... | 257/369 |
| 2005/0023555 A1 * | 2/2005 | Yoshida et al. | ............... | 257/192 |
| 2005/0133866 A1 * | 6/2005 | Chau et al. | .................... | 257/348 |
| 2006/0214160 A1 * | 9/2006 | Furukawa et al. | ............. | 257/40 |
| 2007/0046287 A1 * | 3/2007 | Vervaeke et al. | ............ | 324/251 |
| 2008/0048183 A1 * | 2/2008 | Ohsawa et al. | ................ | 257/40 |

FOREIGN PATENT DOCUMENTS

| | | |
|---|---|---|
| EP | 1 102 335 A2 | 5/2001 |
| GB | 2 275 569 A | 8/1994 |
| JP | 55-117281 | 9/1980 |

OTHER PUBLICATIONS

Kane, B.E. et al., "High mobility GaAs heterostructure field effect transistor for nanofabrication in which dopant-induced disorder is eliminated," Applied Physics Letters, vol. 67, No. 9, pp. 1262-1264, Aug. 28, 1995.

(Continued)

*Primary Examiner*—Phat X Cao
*Assistant Examiner*—Diana C Garrity
(74) *Attorney, Agent, or Firm*—John F. McCabe

(57) ABSTRACT

An apparatus includes a field-effect transistor (FET). The FET includes a region of first semiconductor and a layer of second semiconductor that is located on the region of the first semiconductor. The layer and region form a semiconductor heterostructure. The FET also includes source and drain electrodes that are located on one of the region and the layer and a gate electrode located to control a conductivity of a channel portion of the semiconductor heterostructure. The channel portion is located between the source and drain electrodes. The gate electrode is located vertically over the channel portion and portions of the source and drain electrodes.

13 Claims, 9 Drawing Sheets

OTHER PUBLICATIONS

PCT International Search Report dated Apr. 7, 2008 (PCT/US2007/020477) 4 pages.
English translation of Abstract of Japanese Patent Application Publication JP 55-1177281, Publication Date: Sep. 9, 1980, 1 page.

Kane, B.E. et al., "Variable density high mobility two-dimensional electron and hole gases in a gated GaAs/Al$_x$Ga$_{1-x}$As heterostructure," Applied Physics Letters, vol. 63, No. 15, pp. 2132-2134, Oct. 11, 1993.

* cited by examiner

FIELD-EFFECT TRANSISTORS WHOSE GATE ELECTRODES ARE OVER SEMICONDUCTOR HETEROSTRUCTURES AND PARTS OF SOURCE AND DRAIN ELECTRODES

BACKGROUND

1. Field of the Invention

The invention relates to heterojunction field-effect transistors and to methods for making and operating heterojunction field-effect transistors.

2. Discussion of the Related Art

A field-effect transistor (FET) may have a $Al_xGa_{(1-x)}As/GaAs$ heterostructure, a gate electrode, and metallic source and drain electrodes. Between the source and drain electrodes, the $Al_xGa_{(1-x)}As$ layer may form a mesa-like structure that supports the gate electrode above the source and drain electrodes. The mesa-like structure electrically may isolate the gate electrode from the source and drain electrodes and the heterostructure interface. The edges of the metallic source and drain electrodes may be aligned to edges of the gate electrode to enable good performance.

BRIEF SUMMARY

In some field-effect transistors (FETs), edges of the metallic source and drain electrodes are aligned to edges of the metallic gate electrode to enable good performance. Unfortunately, such an alignment may be difficult to produce without producing a short between the metallic source or drain electrode and the metallic gate electrode. Various embodiments provide FETs that are based on semiconductor heterostructures in which edges of the gate electrode are not aligned with edges of the source and drain electrodes.

One embodiment features an apparatus that includes an FET. The FET includes a region of first semiconductor and a layer of second semiconductor that is located on the region of the first semiconductor. The layer and region form a semiconductor heterostructure. The FET also includes source and drain electrodes that are located on one of the region and the layer and a gate electrode located to control a conductivity of a channel portion of the semiconductor heterostructure. The channel portion is located between the source and drain electrodes. The gate electrode is located vertically over the channel portion and portions of the source and drain electrodes.

In some embodiments, the heterojunction is in a $GaAs/Al_xGa_{(1-x)}As$ heterostructure, wherein $0<x<1$.

In some embodiments, the FET further includes a dielectric layer located between the channel portion and the gate electrode and between the gate electrode and the portions of the source and drain electrodes.

Another embodiment features a method. The method includes providing a semiconductor heterostructure and forming source and drain electrodes on the semiconductor heterostructure. The method includes depositing a dielectric layer over parts of the source and drain electrodes and the part of semiconductor heterostructure located between the source and drain electrodes. The method includes forming a gate electrode vertically over the part of the semiconductor heterostructure between the source and drain electrodes and vertically over parts of the source and drain electrodes.

In some embodiments, the heterostructure is a $GaAs/Al_xGa_{(1-x)}As$ heterostructure, wherein $0<x<1$.

BRIEF DESCRIPTION OF THE DRAWINGS

In the Figures and text, like reference numerals indicate elements with similar functions.

In the Figures, the relative dimensions of some features may be exaggerated to more clearly illustrate one or more of the structures therein.

Herein, various embodiments are described more fully by the Figures and the Detailed Description of Illustrative Embodiments. Nevertheless, the inventions may be embodied in various forms and are not limited to the embodiments described in the Figures and Detailed Description of Illustrative Embodiments.

DETAILED DESCRIPTION OF ILLUSTRATIVE EMBODIMENTS

Herein, a semiconductor heterostructure refers to a structure in which a layer of a first semiconductor is located on a region of a second semiconductor, wherein the first and second semiconductors are crystalline and are formed of different alloys. The portion of the semiconductor heterojunction that is near the interface between the layer and region is referred to as a semiconductor heterojunction. The layer of first semiconductor may be epitaxially grown, e.g., on the region of second semiconductor.

Figure 1:
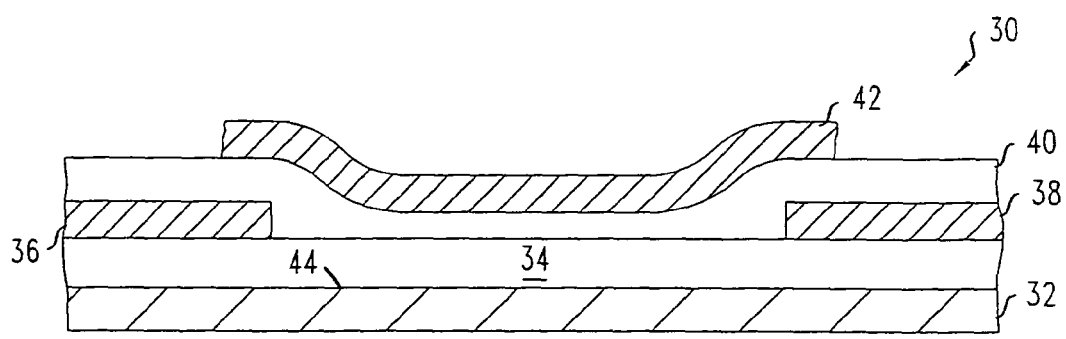
FIG. 1 is a cross-sectional view of a FET with a semiconductor heterostructure and a gate electrode that is not aligned to the source and drain electrodes.

FIG. 1 illustrates a field-effect transistor (FET) 30, which is configured to trap a two-dimensional gas of charged carriers (2DGCC), i.e., electrons or holes, at a semiconductor heterojunction. The FET 30 includes a region 32 of a first crystalline semiconductor, a layer 34 of second crystalline semiconductor, a source electrode 36, a drain electrode 38, a dielectric layer 40, and a gate electrode 42. The layer 34 of the second crystalline semiconductor is located on a flat surface of the region 32 of the first crystalline semiconductor. The first and second crystalline semiconductors have different alloy compositions so that their interface 44 is a semiconductor heterojunction. The source and drain electrodes 36, 38 are located on the layer of second semiconductor 34. The dielectric layer 40 vertically overlies the part of the layer 34 of second semiconductor that is located between the source and drain electrodes 36, 38 and that overlays parts of the source and drain electrodes 36, 38 themselves. The gate electrode 42 is located on the dielectric layer 40 and vertically overlays both parts of the source and drain electrodes 36, 38 and the part of the layer 34 of second semiconductor that is located between the source and drain electrodes 36, 38. For that reason, edges of the gate electrode 42 are not aligned with the edges of the source and drain electrodes 36, 38. The underlying dielectric layer 40 electrically insulates the gate electrode 42 from both the layer of second semiconductor 34 and the source and drain electrodes 36, 38.

In various embodiments, the source and drain electrodes 36, 38 have a conducting contact with the semiconductor heterojunction. For example, the conducting material of the source and drain electrodes 36, 38 may be vertically diffused into the underlying layer 34 of second semiconductor to form a highly conducting connection with the semiconductor heterojunction. For that reason, the bottom boundary of the source and drain electrodes 36, 38 may be rough.

The FET 30 is configured such that a 2DGCC may be trapped at the interface 44 between the layer 34 of second semiconductor and the region 32 of first semiconductor. In particular, the alloy compositions of the first and second semiconductors are selected to enable application of a voltage to the gate electrode 42 to cause such trapping. In the presence of the trapped 2DGCC, the semiconductor heterojunction around the interface 44 functions as an active channel portion of the semiconductor heterostructure. The active channel portion can carry a current between the source and gate electrodes 36, 38.

FIGS. 2A-2D illustrate specific embodiments of the FET 30 in which the active channel portion is an $Al_xGa_{(1-x)}As/GaAs$ heterojunction, i.e., $0<x<1$.

Figure 2:
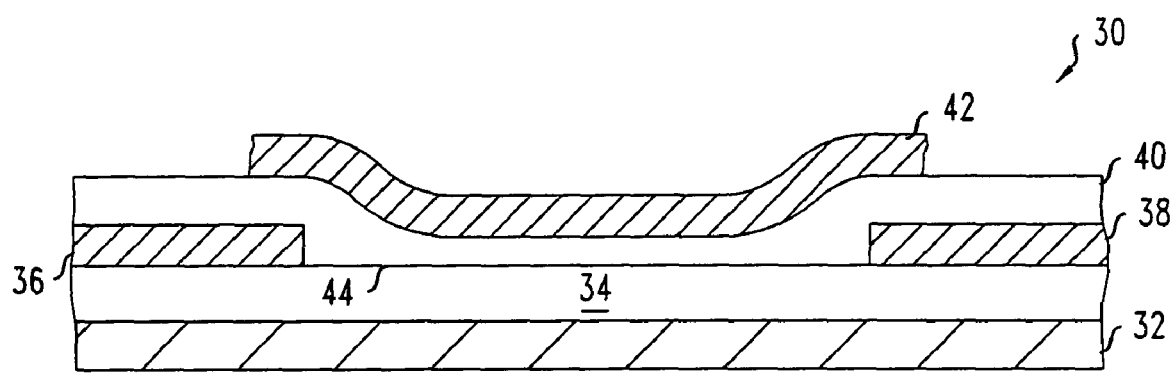
FIG. 2A is a cross-sectional view of an embodiment of the FET of FIG. 1 in which a $GaAs/Al_xGa_{(1-x)}As$ heterostructure is configured for electron-mediated conduction.
FIG. 2B is a cross-sectional view of an embodiment of the FET of FIG. 1 in which a $GaAs/Al_xGa_{(1-x)}As$ heterostructure is configured for hole-mediated conduction.
FIG. 2C is a top view of an embodiment of the FET of FIG. 1 that includes auxiliary gates for laterally controlling conduction in the channel therein.
FIG. 2D is a cross-sectional view of a vertical plane of the FET of FIG. 2C that includes the line labeled A-A.
Figure 2A:
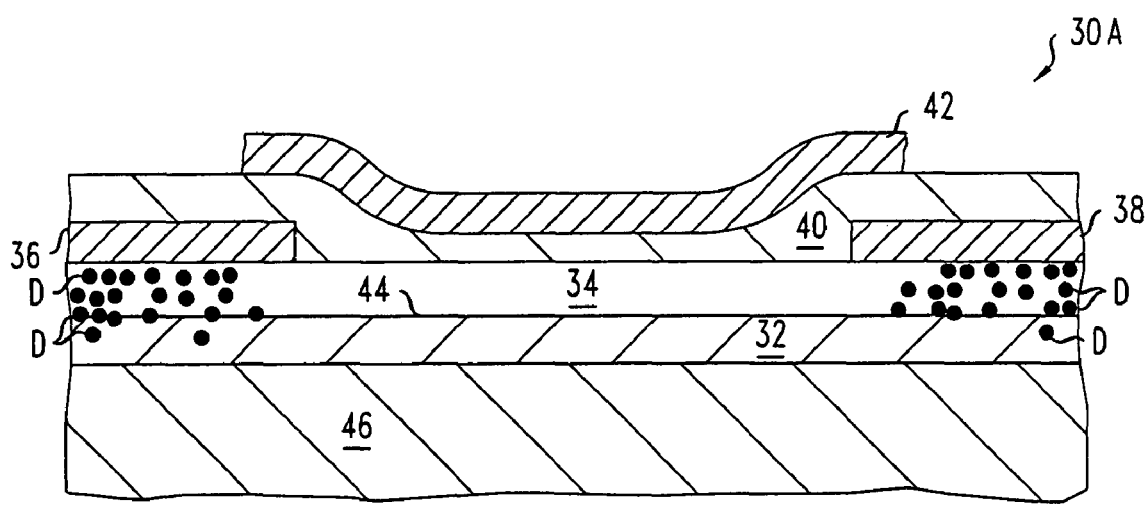

FIG. 2A shows an FET 30A whose active channel portion can provide electron-mediated conduction. The FET 30A includes a crystalline gallium arsenide (GaAs) layer 32, a crystalline aluminum gallium arsenide ($Al_xGa_{(1-x)}As$) layer 34, a source electrode 36, a drain electrode 38, a dielectric layer 40, and a gate electrode 42.

The GaAs layer 32 has an atomically flat top surface 44 and is typically undoped. The GaAs layer 32 may function as a mechanical support substrate or may rest on a surface of a separate support substrate 46, e.g., a [100] of a GaAs substrate.

The crystalline $Al_xGa_{(1-x)}As$ layer 34 is located on the crystalline GaAs layer 32 and forms a smooth $Al_xGa_{(1-x)}As/GaAs$ interface 44 with the crystalline GaAs layer 32. The crystalline $Al_xGa_{(1-x)}As$ layer 34 may have a variety of semiconductor compositions and is also typically undoped. The parameter "x" defining the compound semiconductor alloy may be in the range [0.05, 0.5] and may be in the range [0.1, 0.25]. An exemplary crystalline $Al_xGa_{(1-x)}As$ layers 34 has a thicknesses of about 100 nanometers (nm) and may or may not be capped with a thin GaAs layer (not shown), e.g., about 5 nm of GaAs.

The source and drain electrode 36, 38 are located on the surface of the crystalline $Al_xGa_{(1-x)}As$ layer 34. The source and drain electrodes 36, 38 may be formed, e.g., of metal layers or multi-metal layers. One exemplary conducting multi-metal layer has a bottom-to-top layer structure of about 4 nm of nickel (Ni), about 100 nm of germanium (Ge), about 200 nm of gold (Au), and about 80 nm of Ni. The lower boundaries of the source and drain electrodes 36, 38 may be smooth or unsmooth. The metal/material of the source and drain electrodes 36, 38 is typically vertically diffused into the $Al_xGa_{(1-x)}As$ layer 34, e.g., as illustrated schematically by black dots, D, in FIG. 1. Substantial amounts of metal or conducting material of the source and drain electrodes 36, 38 is diffused, at least, up to the $Al_xGa_{(1-x)}As/GaAs$ interface 44 and may be diffused to somewhat deeper than the $Al_xGa_{(1-x)}As/GaAs$ interface. This substantial amount of diffused metal or conducting material produces a highly conductive connection between the source and drain electrodes 36, 38 and the $Al_xGa_{(1-x)}As/GaAs$ interface 44.

The dielectric layer 40 vertically overlies the part of the $Al_xGa_{(1-x)}As$ layer 36, e.g., the part located between the source and drain electrodes 36, 38, and vertically overlays portions of the source and drain electrodes 36, 38. The dielectric layer 40 may be formed of an inorganic dielectric or an organic dielectric, wherein the selected dielectric is conventionally used to in the fabrication of FETs in the microelectronics industry. An exemplary dielectric layer 40 is an amorphous $Si_3N_4$ or $SiO_2$ layer, e.g., with a thickness of about 120 nm. Another exemplary dielectric layer 40 is a layer of an organic dielectric such as polyimide. The dielectric layer 40 may also include a sequence of dielectric layers.

The gate electrode 42 is located on the dielectric layer 40 and vertically overlays both portions of the source and drain electrodes 36, 38 and the part of the $Al_xGa_{(1-x)}As$ layer 34 located between the source and drain electrodes 36, 38. Thus, edges of the gate electrode 42 are not aligned with the edges of the source and drain electrodes 36, 38. The underlying dielectric layer 40 electrically insulates the gate electrode 42 from the $Al_xGa_{(1-x)}As$ layer 34 and the source and drain electrodes 36, 38. Exemplary gate electrodes 42 may be formed of a conductor conventionally used in microelectronics fabrication. For example, the gate electrode may be an aluminum layer with a thickness of about 30 nm or more.

The FET 30A is configured enable trapping of a 2DEG at or around the interface 44 between the GaAs and $Al_xGa_{(1-x)}As$ layers 32, 34. Indeed, the semiconductor heterojunction located between the source and drain electrodes 36, 38 can function as an active channel for the FET 30A. Around the interface 44, the density of electrons in the trapped 2DEG is determined by the voltage applied to the gate electrode 42. The 2DEG can have a very high mobility in the FET 30A.

In the FET 30A, the presence of a trapped 2DEG may be observed, e.g., by the observation of a quantum Hall effect. Indeed, conventional measurements may show the presence of several states of the fractional quantum Hall effect.

In some embodiments of the FET 30A, electron densities may be in the range of $0.5 \times 10^{11}/cm^2$ to $2.2 \times 10^{11}/cm^2$ in the trapped 2DEG, and mobilities of the trapped electrons may be larger than $10 \times 10^6$ $cm^2$/V-sec.

Figure 2B:
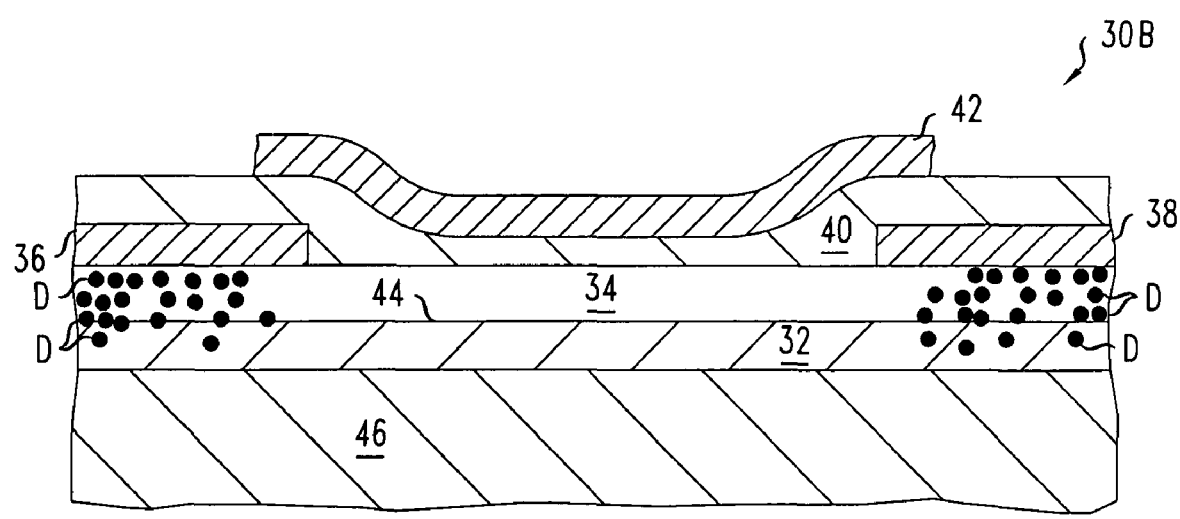

FIG. 2B illustrates another specific embodiment 30B of the FET 30 of FIG. 1. In the FET 30B, the semiconductor heterojunction is again formed around an $Al_xGa_{(1-x)}As/GaAs$ interface 44 where $0<x<1$. The FET 30B is designed to facilitate hole-conduction in an active channel portion of the semiconductor heterojunction, i.e., by producing a two-dimensional hole gas (2DHG). The FET 30B includes a crystalline substrate 46; a crystalline GaAs layer 32; a crystalline $Al_xGa_{(1-x)}As$ layer 34; a source electrode 36; a drain electrode 38; a dielectric layer 40; and a gate electrode 42.

In the FET 30B, the crystalline substrate 46 may be, e.g., a crystalline GaAs substrate with a smooth [100] top surface.

In the FET 30B, the crystalline GaAs layer 32 may be about 200 nm of GaAs that is epitaxially grown on the top surface of the crystalline substrate 46.

In the FET 30B, the crystalline $Al_xGa_{(1-x)}As$ layer 34 may be an epitaxially grown $Al_xGa_{(1-x)}As$ layer, and the alloy parameter may, e.g., satisfy $x \approx 0.24$. The $Al_xGa_{(1-x)}As$ alloy layer may have a thickness of about 200 nm. The $Al_xGa_{(1-x)}As$ layer 34 may or may not be covered by a thin epitaxially grown capping layer, e.g., about 5 nm of GaAs (not shown).

In the FET 30B, metal of the source and drain electrodes 36, 38 may be diffused through the $Al_xGa_{(1-x)}As$ layer 34 to the $Al_xGa_{(1-x)}As/GaAs$ interface 44 as illustrated schematically by black dots, D. Such diffused metal can function as a highly conductive electrical connection between the source and drain electrodes 36, 38 and the semiconductor heterojunction and can also function as a p-type dopant for the $Al_xGa_{(1-x)}As/GaAs$ heterostructure. Exemplary constructions for the source and drain electrodes 36, 38 include Au and beryllium (Be). One exemplary construction provides a bottom AuBe layer with a thickness of about 250 nm and a top Au layer with a thickness of about 60 nm. Another exemplary construction provides a bottom AuBe layer with a thickness of about 80 nm, a middle titanium (Ti) layer with a thickness of about 50 nm, and a top Au layer with a thickness of about 200 nm. In both constructions, the bottom AuBe layer may have, e.g., an alloy composition in which about 98-99 weight percent (wt %) of the alloy is Au and about 1-2 wt % of the alloy is Be.

In the FET 30B, the dielectric layer 40 may be, e.g., silicon nitride or silicon dioxide. For example, the dielectric layer 40 may be formed of about 120 nm of amorphous silicon nitride.

In the FET 30B, the edges of the gate electrode 42 are again not aligned with the edges of the source and drain electrodes 36, 38. Instead, the gate electrode 42 vertically overlays portions of the source and drain electrodes 36, 38 and vertically overlays the portion of the $Al_xGa_{(1-x)}As/GaAs$ heterostructure that is located between the source and drain electrodes 36, 38. An exemplary gate electrode 42 may be about 30 nm or more of vapor-deposited Al.

Figure 2C:
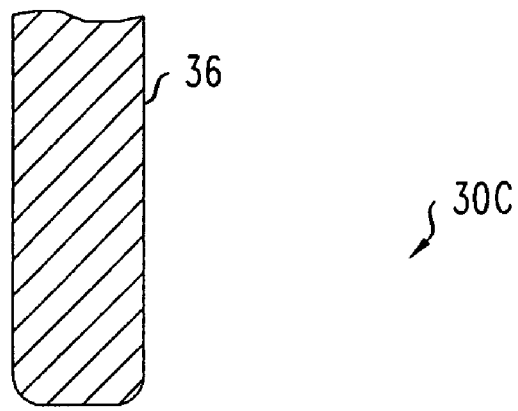
Figure 2C:
Figure 2C:
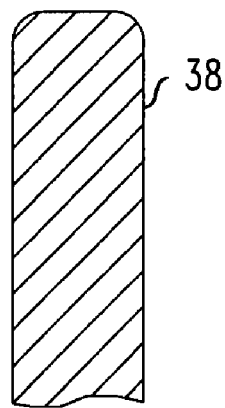
Figure 2D:
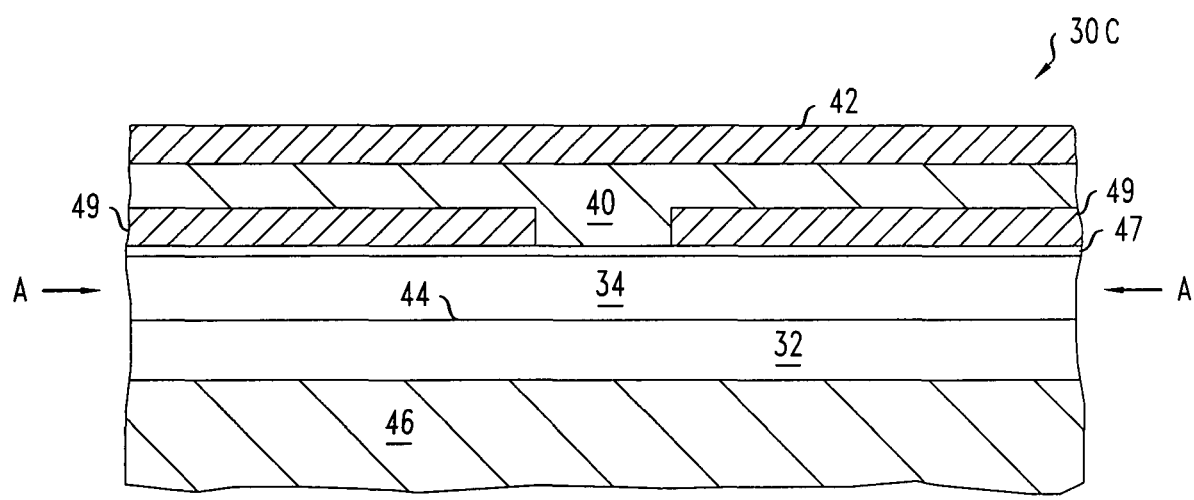

FIG. 2C-2D show another embodiment 30C of the FET 30 of FIG. 1. The FET 30C includes a first crystalline semiconductor layer 32, a second crystalline semiconductor layer 34, a source electrode 36, a drain electrode 38, a dielectric layer 40; an overlying gate electrode 42, and a crystalline substrate 46 as described with respect to the FET 30 of FIG. 1. The elements/features 32, 34, 36, 38, 40, 42, 44, 46 may have, e.g., compositions and/or arrangements as described with respect to the FETs 30A, 30B of FIGS. 2A and 2B. The FET 30C also includes a pair of auxiliary gates 49 that are located on or over the second crystalline semiconductor layer 34. The auxiliary gates 49 may be, e.g., a layer of about 90 nm of Ti and may have various shapes. A very thin dielectric layer 47 may or may not be interposed between the auxiliary gates 49 and the second crystalline semiconductor layer 34.

In some embodiments, the FET 30C may include a thin dielectric layer (not shown) interposed between the auxiliary electrodes 49 and the second crystalline semiconductor layer. For example, the thin dielectric layer may be about 50 nm of silicon nitride. Such a thin dielectric layer would electrically insulate the auxiliary gates 49 from the underlying second crystalline semiconductor layer 34.

During operation, the auxiliary gates 49 can be biased to either laterally limit or more generally deplete the active semiconductor channel of charge carriers in the relevant 2DGCC. For example, the auxiliary gates 49 can be unbiased or biased oppositely than the overlying gate electrode 42. In the later case, the auxiliary gates 49 would typically deplete underlying portions of the semiconductor heterojunction of charge carriers of the 2DGCC, e.g., thereby limiting the lateral extent or conductivity of the active channel that connects the source and drain electrodes 36, 38.

In some embodiments, the FETs 30, 30A, 30B, and 30C of FIGS. 2 and 2A-2D, the semiconductor heterostructure may have mesa structure. Then, portions of the source and drain electrodes 36, 38, the dielectric layer 40, and the gate electrode 42 can overlap the edges of the mesa structure. Thus, portions of these structures will be located on the semiconductor heterostructure and portions of these structures will be located off the semiconductor heterostructure.

Figure 3A:
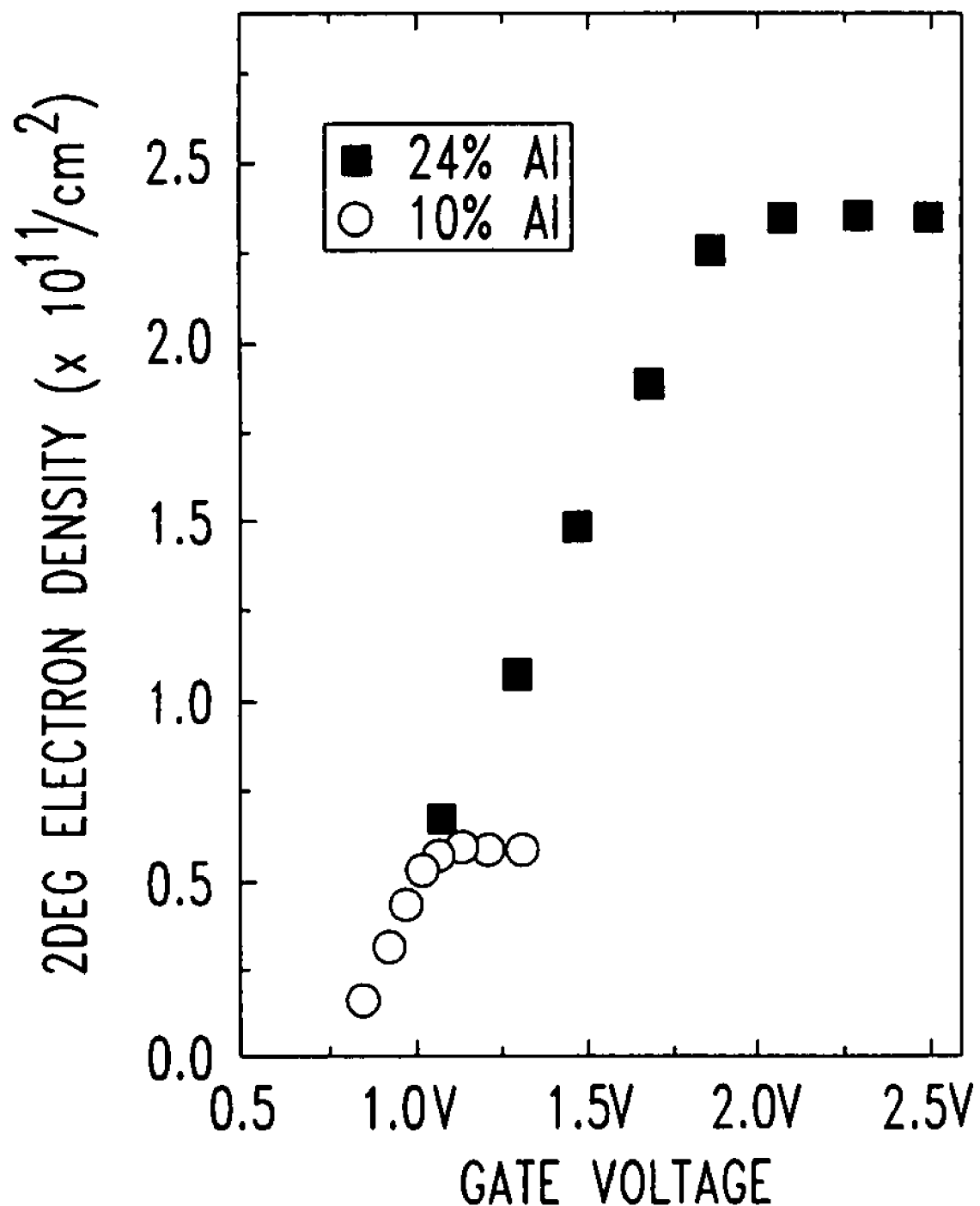
FIG. 3A plots 2DEG carrier density versus gate voltage in two embodiments of the FET of FIG. 2A that have $GaAs/Al_xGa_{(1-x)}As$ heterostructures of different composition.

FIG. 3A schematically shows electron densities in the 2DEG versus gate voltage in volts (V) for embodiments of the FET 30A of FIG. 2A that have different percentages of Al in the $Al_xGa_{(1-x)}As$ layer 34. The data for open circles corresponds to an FET 30A whose $Al_xGa_{(1-x)}As$ layer 34 has an alloy parameter "x" of about 0.1, i.e., substantially an $Al_{0.1}Ga_{0.9}As$ layer. The data for the closed squares corresponds to an FET 30A whose $Al_xGa_{(1-x)}As$ layer 34 has an alloy parameter "x" of about 0.24, i.e., substantially an $Al_{0.24}Ga_{0.76}As$ layer. The illustrated values show that electron densities of $0.5 \times 10^{11}$ per square centimeter ($/cm^2$) are achievable in such embodiments of the FET 30A. The illustrated values also show that maximum achievable electron densities in the 2DEG vary with the percentage of Al in the $Al_xGa_{(1-x)}As$ layer 34. Notably, the electron density in the 2DEG appears to attain a maximum value at an applied gate voltage such that larger applied gate voltages cannot cause large increases to this density.

Figure 3B:
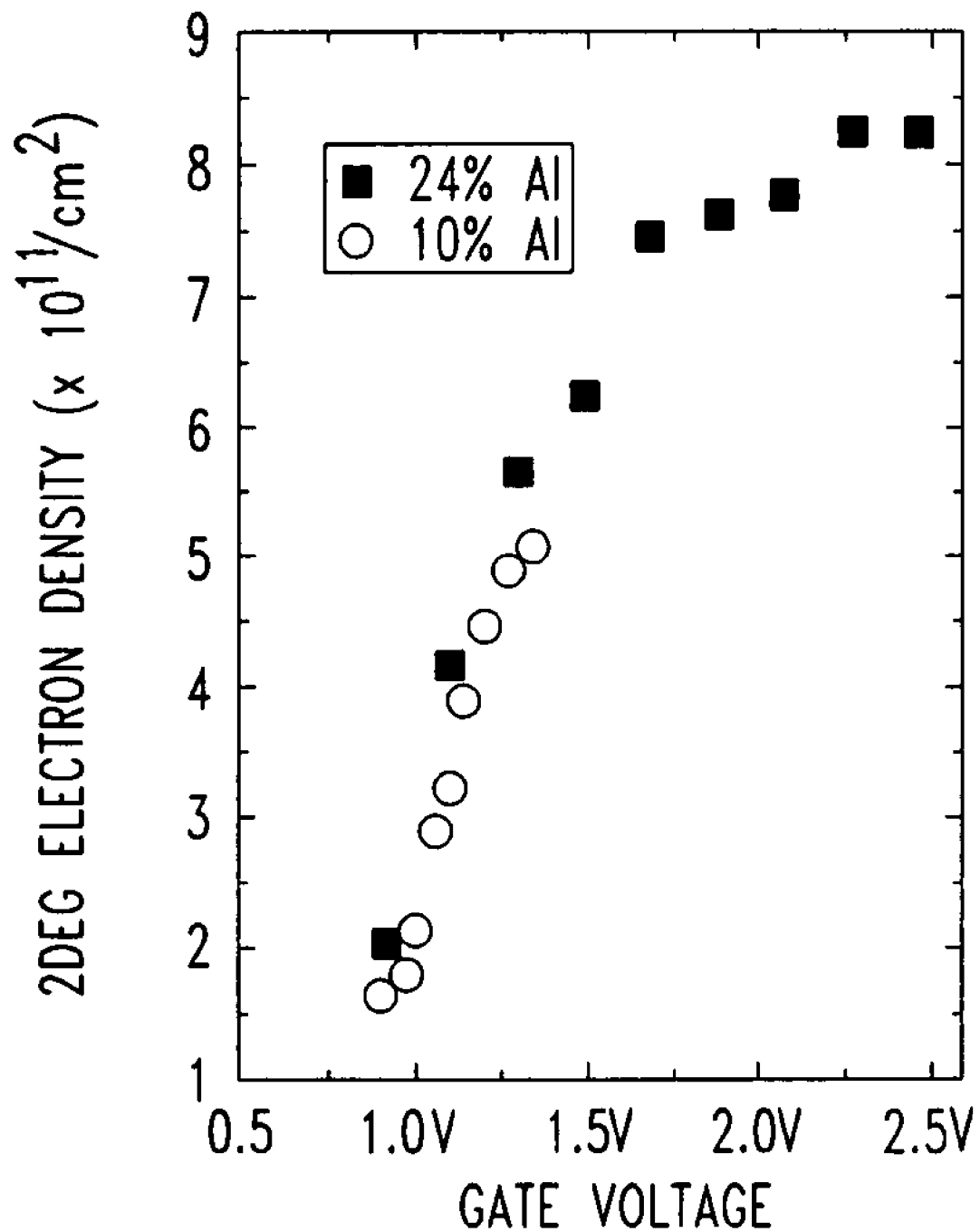
FIG. 3B plots electron mobility versus gate voltage for the embodiments of the FETs whose 2DEG carrier density versus gate voltage plots are shown in FIG. 3A.

FIG. 3B schematically shows data for electron mobilities in square centimeters per volt-seconds ($cm^2/V$-sec) versus gate voltage for the same two embodiments of the FET 30A. The open circles and closed squares correspond to FETs 30A whose $Al_xGa_{(1-x)}As$ layers 34 have alloy parameters of about 0.1 and about 0.24, respectively. The illustrated values show that both embodiments of the FET 30A are able to produce electron mobilities of about $4 \times 10^6$ $cm^2/V$-sec or higher.

Referring again to FIG. 1, other embodiments of the FET 30 may have different semiconductor heterostructures. In particular, the various embodiments are not intended to be limited to FETs 30 that are based on the $Al_xGa_{(1-x)}As/GaAs$ heterostructure. Instead, the embodiments of the FET 30 are intended to include any semiconductor heterostructure that is capable of trapping a 2DGCC of substantial density at the heterojunction interface 44 thereof in response to application of an appropriate voltage to the gate electrode 42. Based on the above teachings, one of skill in the art may be able to construct embodiments of the FET 30 of FIG. 1 with semiconductor heterostructures other than the $Al_xGa_{(1-x)}As/GaAs$ heterostructure without performing undue experimentation. For example, the FET 30 may have a semiconductor heterostructure that includes a silicon-germanium ($Si_xGe_{(1-x)}$)/Si heterojunction where $0<x<1$.

Figure 4:
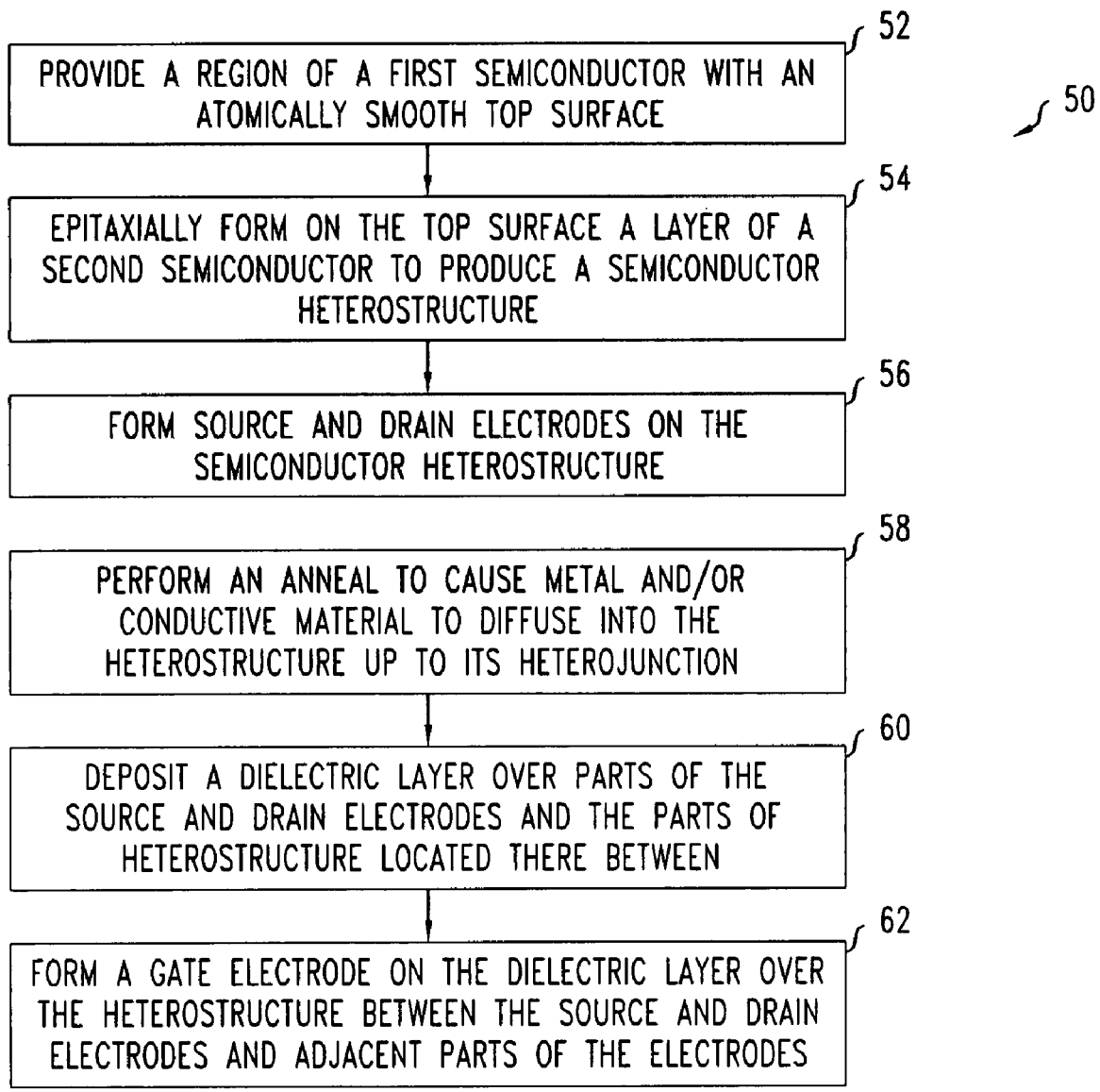
FIG. 4 is a flow chart illustrating a method of fabricating an FET with a $GaAs/Al_xGa_{(1-x)}As$ heterostructure and a gate electrode that is not aligned to the source and drain electrodes, e.g., the FET of FIG. 2A.

FIG. 4 illustrates a method 50 for fabricating an FET with a semiconductor heterostructure, e.g., a $GaAs/Al_xGa_{(1-x)}As$ heterostructure where $0<x<1$. In the FET, the edges of the gate electrode are not aligned to the edges of the source and drain electrodes, e.g., as in the FETs 30, 30A, 30B, 30C of FIGS. 2 and 2A-2D.

The method 50 includes providing a region of a first crystalline semiconductor with an atomically smooth top surface (step 52). The region of first material may be a GaAs layer, e.g., GaAs layer 32 of FIGS. 2A-2B and 2D. The providing step 52 may include performing a conventional epitaxial growth of the GaAs on a substantially lattice-matched crystalline substrate, e.g., the substrate 46 of FIG. 2A. The epitaxial growth may produce, e.g., about 200 nm of GaAs e.g., on the [100] surface of a crystalline GaAs substrate.

The method 50 includes forming on the top surface of the region of first semiconductor a layer of a second crystalline semiconductor thereby producing a semiconductor heterojunction (step 54). The layer of second crystalline semiconductor may be an $Al_xGa_{(1-x)}As$ layer, e.g., the $Al_xGa_{(1-x)}As$ layer 34 of FIG. 2A. The forming step 54 may involve performing a conventional epitaxial growth of $Al_xGa_{(1-x)}As$, e.g., on an epitaxially grown GaAs layer. Such an epitaxial growth may produce an $Al_xGa_{(1-x)}As$ layer with a thickness of about 100 nm or more. During the epitaxial growth the molar Al fraction may be controlled so that the $Al_xGa_{(1-x)}As$ layer has an alloy parameter "x" in the range [0.05, 0.5] or in the range [0.1, 0.25], e.g., an "x" of about 0.1 or about 0.24. In some such embodiments, the method 50 may also include epitaxially growing a thin GaAs cap layer on the $Al_xGa_{(1-x)}As$ layer. The GaAs cap layer is typically thick enough to protect the $Al_xGa_{(1-x)}As$ layer from oxidation when the $Al_xGa_{(1-x)}As$ layer is exposed to the atmosphere at standard conditions. For example, the GaAs cap layer may have a thickness of about 5 nm.

In some embodiments, the method 50 may include doing a mask-controlled etch to produce a mesa structure from the semiconductor heterostructure produced at the forming step 54. For the $Al_xGa_{(1-x)}As/GaAs$, one suitable wet etchant is a solution of 100 volume parts $H_2O$, 10 volume parts phosphoric acid, and 2 volume parts of 30% $H_2O_2$. For a starting the Al$_x$Ga$_{(1-x)}$As/GaAs heterostructure structure that includes about 100 nm of the Al$_x$Ga$_{(1-x)}$As on about 200 nm GaAs, the wet etch may produce a mesa with a height of about 200 nm.

Next, the method 50 includes forming source and drain electrodes, e.g., the source and drain electrodes 36, 38, on the semiconductor heterostructure that was produced at the step 54 (step 56). For the above-described Al$_x$Ga$_{(1-x)}$As/GaAs heterostructure, the source and drain electrodes are formed on the Al$_x$Ga$_{(1-x)}$As layer or GaAs cap layer as appropriate. The forming step 56 may include performing one or more conventional metal vapor-depositions under the control of a mask, e.g., a mask produced by a conventional lithographic process. The source and drain electrodes may be formed of a metal layer or a metal multi-layer and may have various thicknesses and lateral dimensions.

For an Al$_x$Ga$_{(1-x)}$As/GaAs heterostructure that provides electron-mediated conduction, the forming step 56 may involve performing a series of depositions that forms a metal multilayer for the source and drain electrodes. From bottom-to-top, the metal multilayer may include, e.g., 4 nm of Ni, 200 nm of Au, 100 nm of Ge, and 80 nm of Ni.

For an Al$_x$Ga$_{(1-x)}$As/GaAs heterostructure that provides hole-mediated conduction, the forming step 56 may also involve performing a series of depositions that forms a metal multilayer. From bottom-to-top, one metal multilayer may include, e.g., an AuBe layer with a thickness of about 250 nm and an Au layer with a thickness of about 60 nm. The bottom AuBe layer may have an exemplary alloy composition in which about 98 wt % to about 99 wt % is Au and about 1 wt % to about 2 wt % is Be.

In embodiments that include forming an Al$_x$Ga$_{(1-x)}$As/GaAs mesa structure, the method 50 may position the source and drain electrodes to overlap edges of the mesa.

The method 50 may include then, performing an anneal to cause metal and/or conductive material to diffuse vertically from the deposited source and drain electrodes to into the underlying semiconductor heterostructure (step 58). Such an anneal causes a substantial amount of the metal or conductive material of the source and drain electrodes to diffuse to the heterojunction, e.g., to the Al$_x$Ga$_{(1-x)}$As/GaAs interface for embodiments based on above Al$_x$Ga$_{(1-x)}$As/GaAs heterostructure. For the exemplary Al$_x$Ga$_{(1-x)}$As/GaAs heterostructure of FIG. 2B, one anneal includes rapidly ramping the temperature of the starting structure from room temperature to about 180° C., e.g., in about 20 seconds, and then, ramping the temperature to about 440° C. to about 450° C. and maintaining the structure at about 440° C. to about 450° C. for about 10-15 minutes. Of course, the anneal time will vary with the thickness of the Al$_x$Ga$_{(1-x)}$As layer and the thickness of any GaAs cap layer.

In some embodiments, the method 50 may also include performing a mask-controlled metal deposition to form the auxiliary gate electrodes on or over the semiconductor heterostructure, e.g., to form the electrodes 49 of FIGS. 2C-2D. This deposition step may involve performing a conventional process to deposit about 90 nm of Ti. Prior to the Ti deposition, the method may also include performing a conventional deposition to produce a layer of about 50 nm of insulating silicon nitride on the semiconductor heterostructure.

The method 50 includes depositing a dielectric layer over that portion of the semiconductor heterostructure located between the source and drain electrodes and depositing the dielectric layer over adjacent parts of the source and drain electrodes themselves (step 60). The dielectric layer may be, e.g., Si$_3$N$_4$ or SiO$_2$ and may be deposited by any conventional process. For the above-described Al$_x$Ga$_{(1-x)}$As/GaAs heterostructure, a conventional plasma enhanced chemical vapor deposition (PECVD) of amorphous Si$_3$N$_4$ can, e.g., produce the dielectric layer, the dielectric layer 40 of FIGS. 2A-2B and 2D. The dielectric layer may have an exemplary thickness of about 120 nm or more.

The method 50 also includes forming a gate electrode on the dielectric layer (step 62). The gate electrode is formed over the region between the source and drain electrodes and over adjacent portions of the source and drain electrodes themselves. That is, the forming step 62 produces a gate electrode whose edges are not aligned vertically over the edges of the source and drain electrodes. One exemplary process for forming the gate electrode includes forming a patterned mask on the dielectric layer, doing an evaporation-deposition of metal to form the gate electrode, and then removing the mask by a conventional process. For example, the deposition may involve thermally evaporating Al to deposit Al at a rate of about 0.5 nm/sec for 10 seconds and continuing the deposition at a rate of about 1.5 nm/sec until a layer of about 30 nm or more of Al has been deposited.

In some embodiments, the method 50 also includes dispersing a covering of large non-sticking grains, e.g., indium lumps, on the source and drain electrodes prior to performing the dielectric deposition of step 60. The grains are selected such that a mild mechanical processes can remove the grains thereby exposing metallic contact areas on the underlying source and drain electrodes. The exposed metallic contact areas can then, be used to make electrical connections to the source and drain electrodes of the final FET.

From the above disclosure, the figures, and the claims, other embodiments will be apparent to those of skill in the art.

What is claimed is:

1. An apparatus, comprising:
a field-effect transistor comprising
a region of first inorganic semiconductor;
a layer of second inorganic semiconductor located on the region of the first inorganic semiconductor, the layer and region forming a semiconductor heterostructure;
source and drain electrodes being located in part on the layer; and
a gate electrode located to control a conductivity of a channel portion of the semiconductor heterostructure, the channel portion being located between the source and drain electrodes, the gate electrode being located vertically over the channel portion and being located over portions of the source and drain electrodes, the gate electrode and parts of the source and drain electrodes being located over a same side of the layer and being located over a same side of the region; and
wherein the transistor is capable of trapping a two-dimensional charge carrier gas in the channel portion of the semiconductor heterostructure.

2. The apparatus of claim 1, wherein the field-effect transistor further comprises a dielectric layer located between the channel portion and the gate electrode and between the gate electrode and the portions of the source and drain electrodes.

3. The apparatus of claim 1, wherein the first and second semiconductors include gallium and arsenic.

4. The apparatus of claim 3, wherein one of the first semiconductor and the second semiconductor includes aluminum.

5. The apparatus of claim 4, wherein the field-effect transistor further comprises a dielectric layer located between the channel portion and the gate electrode and between the gate electrode and the portions of the source and drain electrodes.

6. The apparatus of claim 4, wherein the one of the first semiconductor and the second semiconductor has a ratio atoms of the aluminum to atoms of the gallium atoms, the ratio being x/(1-x), $0.1 \leq x \leq 0.25$.

7. The apparatus of claim 1, wherein the semiconductor heterostructure includes an $Al_xGa_{(1-x)}As/GaAs$ interface and the alloy parameter x satisfies $0<x<1$.

8. The apparatus of claim 7, wherein the alloy parameter x is in the range [0.05, 0.5].

9. An apparatus, comprising:
a field-effect transistor comprising:
a region of first inorganic semiconductor;
a layer of second inorganic semiconductor located on the region of the first inorganic semiconductor, the layer and region forming a semiconductor heterostructure;
source and drain electrodes being located in part on the layer; and
a gate electrode located to control a conductivity of a channel portion of the semiconductor heterostructure, the channel portion being located between the source and drain electrodes, the gate electrode being located vertically over the channel portion and being located over portions of the source and drain electrodes, the gate electrode and parts of the source and drain electrodes being located over a same side of the layer and being located over a same side of the region; and
wherein material of the source and drain electrodes is diffused into adjacent portions of the layer such that said material is diffused at least up to an interface between the layer and the region.

10. The apparatus of claim 9, wherein the source and drain electrodes include a metal, the metal being diffused into the layer.

11. The apparatus of claim 9, wherein the field-effect transistor further comprises a dielectric layer located between the channel portion and the gate electrode and between the gate electrode and the portions of the source and drain electrodes.

12. The apparatus of claim 9, wherein the semiconductor heterostructure includes an $Al_xGa_{(1-x)}As/GaAs$ interface and the alloy parameter x satisfies $0<x<1$.

13. The apparatus of claim 12, wherein the alloy parameter x is in the range [0.05, 0.5].

* * * * *